(12) United States Patent
Iijima

(10) Patent No.: US 8,242,597 B2
(45) Date of Patent: Aug. 14, 2012

(54) CRYSTAL STRUCTURE OF A SOLDER BUMP OF FLIP CHIP SEMICONDUCTOR DEVICE

(75) Inventor: Tadashi Iijima, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 12/497,371

(22) Filed: Jul. 2, 2009

(65) Prior Publication Data

US 2010/0052162 A1 Mar. 4, 2010

(30) Foreign Application Priority Data

Aug. 29, 2008 (JP) ................. 2008-221534

(51) Int. Cl.
*H01L 23/48* (2006.01)
*H01L 23/52* (2006.01)
*H01L 29/40* (2006.01)

(52) U.S. Cl. ........ 257/737; 257/738; 257/778; 257/779; 257/780; 257/E23.021; 257/E23.069; 257/E21.508

(58) Field of Classification Search ................. 257/737, 257/738, 780, E23.021, E23.069, E21.508, 257/778, 779
See application file for complete search history.

(56) References Cited

U.S. PATENT DOCUMENTS

| 4,976,393 | A | * | 12/1990 | Nakajima et al. ............. 228/111 |
| 5,965,197 | A | * | 10/1999 | Jin et al. .......................... 427/180 |
| 6,053,395 | A | * | 4/2000 | Sasaki ........................ 228/180.22 |
| 6,205,264 | B1 | * | 3/2001 | Jin et al. ............................ 385/14 |
| 7,601,612 | B1 | * | 10/2009 | Master et al. .................. 438/455 |
| 2003/0025202 | A1 | | 2/2003 | Mikagi et al. |
| 2004/0121267 | A1 | | 6/2004 | Jang |
| 2004/0197979 | A1 | | 10/2004 | Jeong et al. |
| 2004/0245648 | A1 | * | 12/2004 | Nagasawa et al. ............. 257/772 |
| 2005/0014355 | A1 | | 1/2005 | Chan et al. |
| 2005/0030125 | A1 | * | 2/2005 | Nakano et al. ................. 333/133 |
| 2005/0034791 | A1 | * | 2/2005 | Lee et al. ....................... 148/400 |
| 2005/0146052 | A1 | * | 7/2005 | Sakamoto et al. ............. 257/780 |
| 2006/0038302 | A1 | * | 2/2006 | Zeng ............................... 257/779 |
| 2006/0055037 | A1 | * | 3/2006 | Park et al. ..................... 257/737 |
| 2006/0267157 | A1 | * | 11/2006 | Edwards et al. .............. 257/646 |
| 2008/0036079 | A1 | * | 2/2008 | Chen et al. .................... 257/737 |
| 2008/0121903 | A1 | * | 5/2008 | Hiramatsu et al. .............. 257/89 |
| 2008/0203578 | A1 | * | 8/2008 | Nakasato et al. .............. 257/773 |
| 2008/0230899 | A1 | * | 9/2008 | Amatatsu et al. ............. 257/737 |
| 2010/0200271 | A1 | * | 8/2010 | Arvin et al. ................. 174/126.1 |
| 2010/0295191 | A1 | * | 11/2010 | Kikuchi et al. ............... 257/784 |

FOREIGN PATENT DOCUMENTS

| JP | 2003-31576 | 1/2003 |
| JP | 2003-152007 | 5/2003 |
| JP | 2004-207685 | 7/2004 |

OTHER PUBLICATIONS

Notification of Reason(s) for Refusal issued by the Japanese Patent Office on Jan. 10, 2012, for Japanese Patent Application No. 2008-221534, and English-language translation thereof.

* cited by examiner

*Primary Examiner* — Evan Pert
*Assistant Examiner* — Teresa M Arroyo
(74) *Attorney, Agent, or Firm* — Finnegan, Henderson, Farabow, Garrett & Dunner, L.L.P.

(57) ABSTRACT

A semiconductor device, includes a semiconductor substrate; and a solder bump part, which is formed on the semiconductor substrate and in which no grain boundary extends equal to or over ⅓ of a diameter dimension of said solder bump part from an outer circumferential surface between an end of a connection part with the semiconductor substrate and a lateral portion.

12 Claims, 10 Drawing Sheets

CRYSTAL STRUCTURE OF A SOLDER BUMP OF FLIP CHIP SEMICONDUCTOR DEVICE

CROSS-REFERENCE TO RELATED APPLICATION

This application is based upon and claims the benefit of priority from prior Japanese Patent Application No. 2008-221534 filed on Aug. 29, 2008 in Japan, the entire contents of which are incorporated herein by reference.

BACKGROUND OF THE INVENTION

1. Field of the Invention

The present invention relates to a semiconductor device and a method for fabricating a semiconductor device. For example, the present invention relates to a crystal structure of a solder bump to be a connection terminal of a flip chip semiconductor device or a method for forming a solder bump.

2. Related Art

Nowadays, a flip chip model, in which a solder bump to be a connection terminal of a semiconductor substrate on which a semiconductor device is formed and a solder bump to be a connection terminal of a package-side circuit substrate on which the semiconductor substrate is to be packaged are linked, is adopted. Particularly in a solder bump formation process of a semiconductor substrate on which a semiconductor device is formed, a layer called UBM (Under Bump Metal) is formed and a resist pattern patterned by using a photo resist is formed on the UBM layer. Then, the opened UBM layer is plated with a material to be a solder bump, and the photo resist and the UBM layers thereunder are removed, thereby forming plating to be a bump material (see Published Unexamined Japanese Patent Application, Publication No. 2004-207685 (JP 2004-207685A), for example). In JP 2004-207685A, a method for fabricating a tin-copper (SnCu) laminated bump, in which a photo resist mask is formed on UBM and then the photo resist mask is plated with copper (Cu) and subsequently with tin (Sn), is described for example. Nowadays, due to environmental problems, lead-free solder containing no lead (Pb) is used even for solder.

However, if a solder bump is formed simply by the method of JP 2004-207685A, there is a problem that bump cracks appear due to a contraction or the like caused by thermal change. Particularly, in many cases, stress concentration occurs in an outer circumferential part (end part) of a connection part of a bump and a semiconductor substrate and from this point, a crack grows into bumps. Thus, if a crack propagates into a bump, the solder bump to be a connection terminal may be broken or, if not broken, resistance thereof will increase. Such problems significantly decrease reliability of solder bumps. However, neither effective method as countermeasures against problems such as bump cracks nor product for which such measures have been taken has been presented.

BRIEF SUMMARY OF THE INVENTION

In accordance with one aspect of the present invention, a semiconductor device includes a semiconductor substrate; and a solder bump part, which is formed on the semiconductor substrate and in which no grain boundary extends equal to or over ⅓ of a diameter dimension of said solder bump part from an outer circumferential surface between an end of a connection part with the semiconductor substrate and a lateral portion.

In accordance with another aspect of this invention, a semiconductor device includes a semiconductor substrate; an another substrate connected to the semiconductor substrate; and a solder bump part, which is arranged between the semiconductor substrate and the another substrate and in which no grain boundary extends equal to or over ⅓ of a diameter dimension of said solder bump part from a part of an outer circumferential surface excepting both of a connection part with the semiconductor substrate and a connection part with the another substrate.

In accordance with a further aspect of the invention, a method for fabricating a semiconductor device includes forming a copper (Cu) film to have an average grain size of 10 μm or less above a semiconductor substrate; forming a solder material film to be a material of a solder bump on the Cu film; and heating the Cu film and the solder material film to change into a substantially spherical shape.

DETAILED DESCRIPTION OF THE INVENTION

The inventor analyzes a crystal structure of solder bump to have found that bump crack resistance can be improved by controlling the grain boundary of a material used for solder bumps. A method for fabricating semiconductor device while restricting formation of a grain boundary that causes bump cracks in a solder bump and semiconductor devices fabricated by the method will be described as embodiments hereinafter.

First Embodiment

In a first embodiment, a semiconductor device and a method for fabricating the semiconductor device when a Cu (copper) film to be one of materials of a solder bump is formed by plating will be described. The first embodiment will be described below using drawings.

Figure 1:
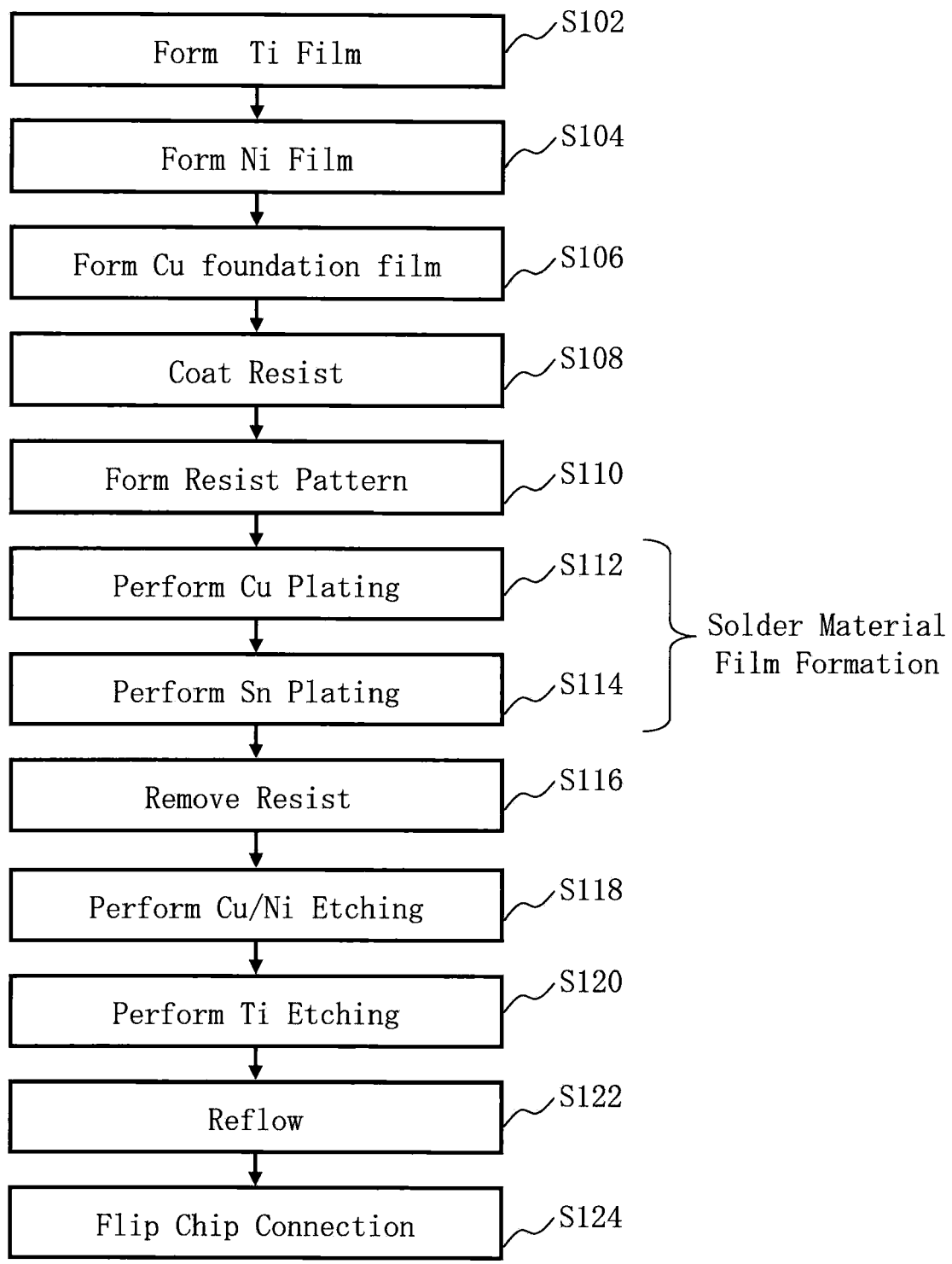
FIG. 1 is a flow chart showing principal parts of a method for fabricating a semiconductor device according to a first embodiment.

FIG. 1 is a flow chart showing principal parts of the method for fabricating a semiconductor device according to the first embodiment. As shown in FIG. 1, a series of processes including a titanium (Ti) film formation process (S102), nickel (Ni) film formation process (S104), Cu foundation film formation process (S106), resist coating process (S108), resist pattern formation process (S110), Cu plating process (S112), tin (Sn) plating process (S114), resist removal process (S116), Cu/Ni etching process (S118), Ti etching process (S120), reflow process (S122), and flip chip connection process (S124) is performed according to the first embodiment. According to the first embodiment, the Cu plating process (S112) and the tin (Sn) plating process (S114) correspond to a solder material film formation process.

FIG. 2A to FIG. 2D are process sectional views showing processes performed corresponding to the flow chart in FIG. 1. FIG. 2A to FIG. 2D show from the titanium (Ti) film formation process (S102) to the resist coating process (S108) in FIG. 1. Processes thereafter will be described later.

Figure 2A:
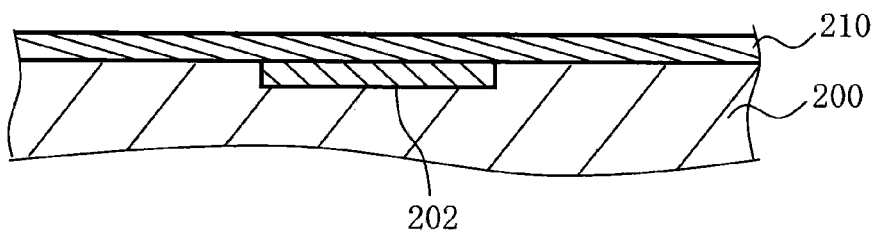
FIG. 2A to FIG. 2D are process sectional views showing processes performed corresponding to the flow chart in FIG. 1.

As shown in FIG. 2A, as the titanium (Ti) film formation process (S102), a Ti film 210 is formed to have a thickness of, for example, 500 nm on the surface of a semiconductor substrate 200 in a sputtering apparatus using a sputter process, which is a kind of the physical vapor deposition (PVD) method. The formation method thereof is not limited to the PVD method and the atomic layer deposition (ALD, or atomic layer chemical vapor deposition (ALCVD)) method or the CVD method may also be used. The coverage can be made higher than that obtained using the PVD method. A silicon wafer of, for example, 300 mm in diameter is used as the semiconductor substrate 200. Here, a device part and wiring part are not illustrated. The semiconductor substrate 200, in which a multilayer interconnection structure is formed and a pad 202 using Aluminum (Al) to be an electrode of the circuit is formed on the top surface thereof is used, for example. The Ti film 210 forms one layer (first layer) of the UBM layers in a solder bump formation process of the semiconductor substrate 200. Adhesiveness of the UBM layers to the electrode pad 202 can be improved by forming the Ti film 210.

Figure 2B:
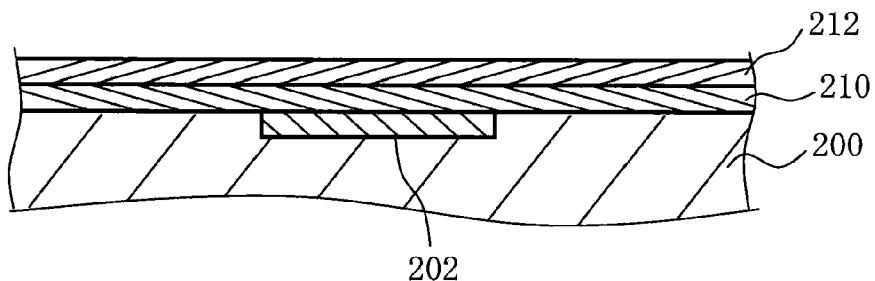

As shown in FIG. 2B, as the nickel (Ni) film formation process (S104), an Ni film 212 is formed on the Ti film 210 to have a thickness of, for example, 500 nm by using the sputter process. Similarly to the Ti film 210, the formation method is not limited to the PVD method and the atomic layer deposition method or the CVD method may also be used. The Ni film 212 forms one layer (second layer) of the UBM layers in the solder bump formation process of the semiconductor substrate 200. Barrier properties of the UBM layers can be improved by forming the Ni film 212.

Figure 2C:
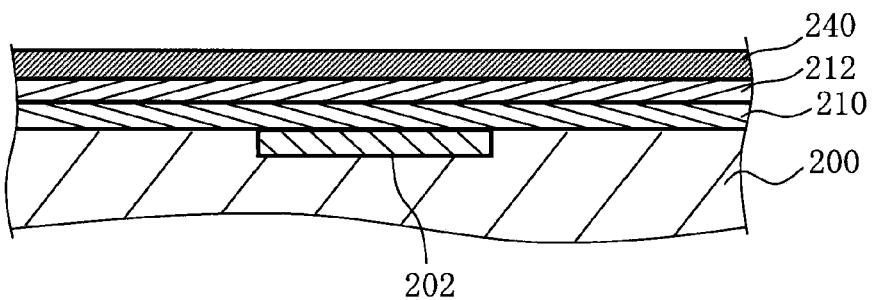

In FIG. 2C, as the Cu foundation film formation process (S106), a Cu film 240 is formed on the Ni film 212 to have a thickness of, for example, 300 nm by using the sputter process. The Cu film 240 forms one layer (third layer) of the UBM layers in the solder bump formation process of the semiconductor substrate 200. The Cu film 240 becomes a seed film to be a cathode electrode in the Cu plating process (S112) to be described later. Here, according to the first embodiment, the crystal sizes (grain sizes) of the Cu film 240 and the orientations of the Cu film 240 are controlled when the Cu film 240 is formed.

Figure 3A:
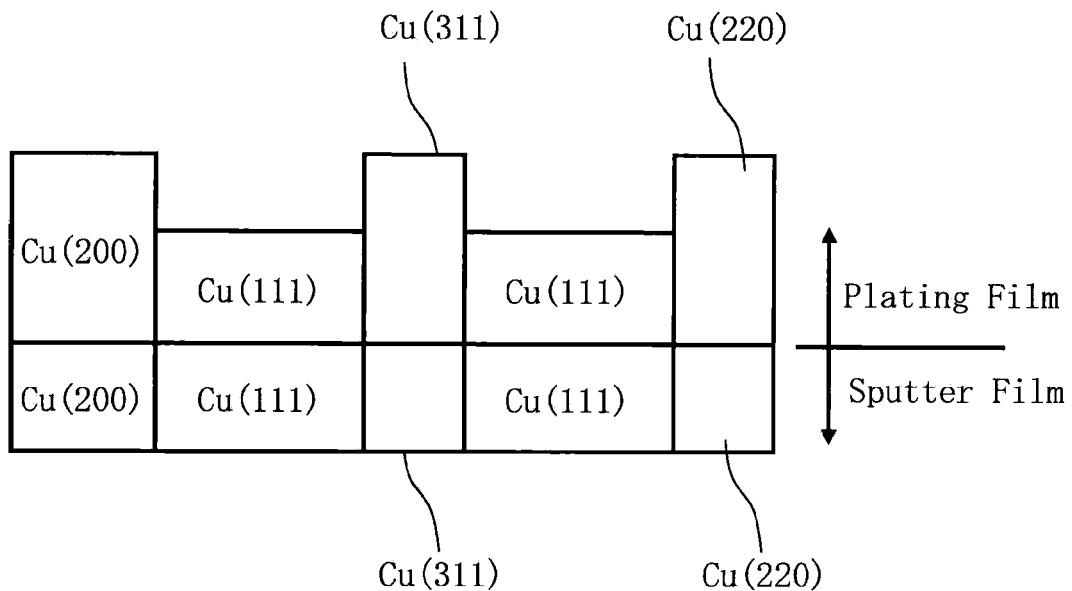
FIG. 3A and FIG. 3B are diagrams exemplifying how Cu grows according to the first embodiment.
Figure 3B:
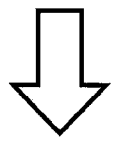
Figure 3B:
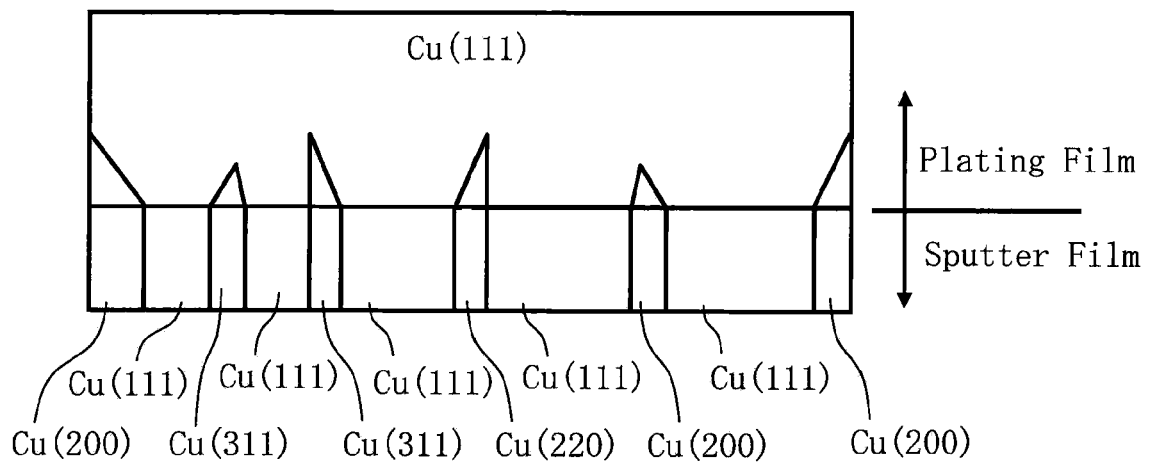

FIG. 3A and FIG. 3B are diagrams exemplifying how Cu grows according to the first embodiment. If the crystal orientations of the Cu film 240 that is formed by the sputter process as a foundation film vary in the film, density difference is caused by different crystal orientations of plating in the Cu plating process (S112) to be described later, and thus, the thickness of plated Cu varies as shown in FIG. 3A resulting in an uneven shape after plating. When Cu plating is performed, epitaxially growth basically follows crystallinity of the Cu film 240 as a foundation film. Here, if grown in a direction of (111) surface orientation (when the plane is viewed from above) with the highest density, the film thickness becomes thinner compared with the (200) orientation. In Cu plating, two electrons are exchanged for one $Cu^{2+}$ ion and thus, an integral value of current and the number of Cu atoms match. Strictly speaking, however, plating efficiency is should be considered and efficiency of 99% or more is normally achieved for Cu plating, in which case 99 or more Cu atoms are plated for 200 electrons.

On the other hand, even if crystal orientations of the Cu film 240 as a foundation film are different, if crystal grains are small (the crystal sizes are small), the (111) orientation region that is dominant on both sides is widened by erosion as shown in FIG. 3B and the orientations are converged into the (111) orientation as the thickness increases so that an even plating film in which crystals are uniform can be formed. If an even Cu plating film with uniform crystals in the (111) orientation can be formed in the Cu plating process (S112), an Sn film formed as an upper layer thereof can also be grown in the (111) orientation by growing to follow crystallinity of the Cu plating film. As a result, the orientations of grain boundary of solder bumps to be finally obtained can be made in almost one direction.

Here, the inventor has found through experiments that a problem of unevenness does not arise if the crystal sizes (grain sizes) of the Cu film 240 as a foundation film formed by the sputter process are 10 μm or less in average when measured by the Electron Back Scattering Pattern (EBSP, also called the Electron Back Scattering Diffraction (EBSD)) method. If the average crystal size exceeds 10 μm, an uneven shape is formed after plating as shown in FIG. 3A. The inventor introduced additive agents into a plating solution to prevent unevenness, but such attempts did not result in prevention of unevenness, even though degrees of influences vary for various additive agents. That is, in order to converge into the (111) orientation while preventing unevenness in a Cu film after plating, it is effective to control the crystal sizes to 10 μm or less in average and to increase the number of crystals whose crystal orientation is the (111) orientation in the Cu film 240 when the Cu film 240 as a foundation film is formed.

A method of controlling impurities in a Cu film is known as one technique to control the average crystal size of the Cu film 240 to 10 μm or less. That is, the crystal sizes can be controlled by controlling an impurity concentration. This is because grain boundary growth of a foundation film depends on the impurity concentration and if, for example, the impurity concentration is high, the crystal size is less likely to increase and if, conversely, the impurity concentration is low, the crystal size is more likely to increase. If the amount of impurities of Cu is too small, the crystal sizes of the Cu sputter film varies. Thus, when the impurity concentration of the Cu film 240 is controlled in the sputter process, the control can be achieved by controlling the purity grade of Cu targets.

For example, when a Cu film was formed by the sputter process using Cu targets of the 4N grade (purity of 99.99% or more), the average grain size of the Cu film was 5 μm. According to experiments by the inventor, crystal growth is more likely to occur in the sputter process using the 6N grade (purity of 99.9999% or more) and thus, the average grain size is more likely to increase and, as a result, it was difficult to control the crystal sizes to have an average of 10 μm or less. In contrast, in the sputter process using the 5N grade (purity of 99.999% or more), it was possible to control the crystal sizes to have an average of 10 μm or less. Thus, in the sputter process, the crystal sizes can be controlled to have an average of 10 μm or less by using Cu targets of the 5N grade (purity of 99.999% or more) or less. Here, Cu targets of the 4N grade capable of easily suppressing an increase in average grain size are used.

Next, in order to increase the number of crystals whose crystal orientations are the (111) orientation in the Cu film 240, it is suitable to form the Cu film 240 at temperature equal to or higher than the room temperature (20° C.) when formed by the sputter process. For example, if formed at temperature between the room temperature and 200° C., the crystal orientation of the Cu film 240 is more likely to be the (111) orientation, which is suitable. If the substrate temperature is made lower than the room temperature by some cooling means, the crystal orientation of the Cu film is more likely to be the (200) orientation, which is unsuitable.

Generally, when a film is formed by the sputter process, the film is often formed while being cooled. A film is formed at least while a substrate being held by an electrostatic chuck in which a cooling medium flows. If the substrate is held by the electrostatic chuck, the chuck surface (holding surface) is adsorbed and the whole chuck surface is in contact with a chuck member, and thus the substrate is more likely to be cooled. Moreover, in the sputter process, a film is normally formed in a pressure lower than the atmospheric pressure (vacuum) and thus, heat is less likely to be lost from the substrate and heat exchange occurs almost exclusively with the chuck member. Therefore, according to the first embodiment, the Cu film 240 is formed in a condition where the electrostatic chuck is off, that is, the substrate is simply placed on the chuck member without operating the electrostatic chuck mechanism. In such a case, the chuck member and the substrate contact only in point or line because the surface of the substrate on the chuck member side is not strictly flat. Since only little heat is exchanged through the point or line in contact, the Cu film 240 can be formed in a substantially non-cooled condition. Or, it is also suitable to form the Cu film 240 without flowing a cooling medium in the electrostatic chuck. It is also suitable to form the Cu film 240 while satisfying the both conditions described above. By thus forming the Cu film 240 in a non-cooled condition, the number of crystals whose crystal orientations are the (111) orientation can be increased in the Cu film 240.

It is suitable to form the Cu film 240 under other process conditions such that DC (bias) is set to 30 A, IR (power) is set to 100 V, the degree of vacuum is set to 30 Pa and argon (Ar) flows at $1.17 \times 10^{-2}$ Pa·m³/s (7 sccm).

Figure 2D:
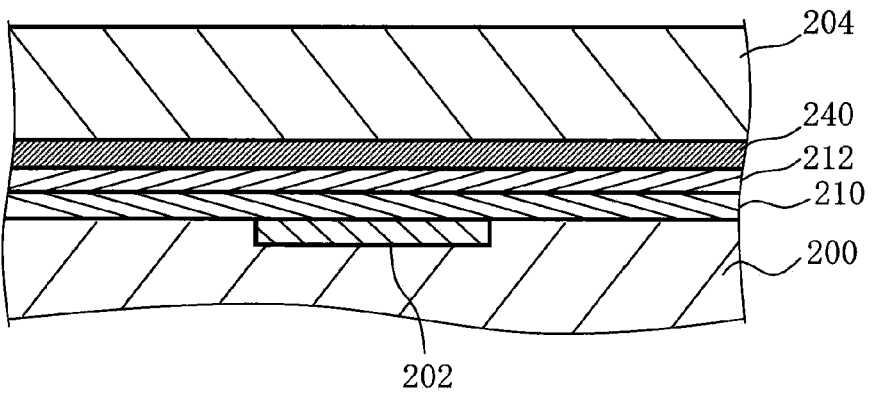

As shown in FIG. 2D, as the resist coating process (S108), a resist film 104 is formed by coating a resist material onto the Cu film 240. The resist film 204 is formed to have a thickness of, for example, 70 μm.

FIG. 4A to FIG. 4D are process sectional views showing processes performed corresponding to the flow chart in FIG. 1. FIG. 4A to FIG. 4D show from the resist pattern formation process (S110) to the resist removal process (S116) in FIG. 1. Processes thereafter will be described later.

Figure 4A:
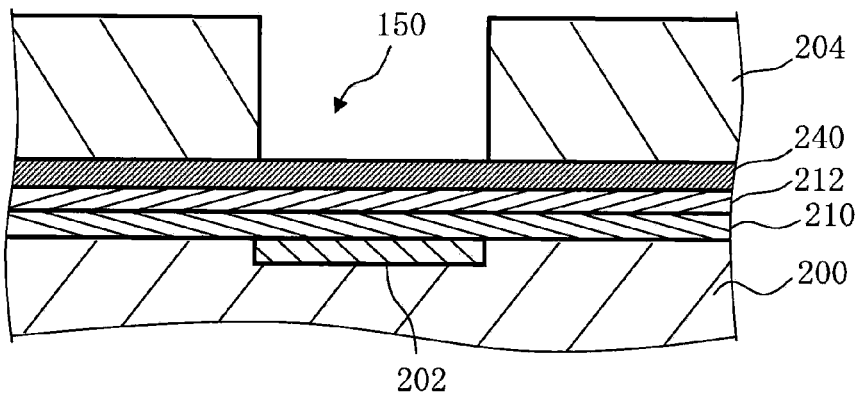
FIG. 4A to FIG. 4D are process sectional views showing processes performed corresponding to the flow chart in FIG. 1.

As shown in FIG. 4A, as the resist pattern formation process (S110), a resist pattern is formed using the resist film 204 by exposing and developing the resist film 204 so that an opening 150 is formed over the electrode pad 202. The opening 150 of a portion to be a bump is patterned by a photolithography process. The opening 150 of a portion to be a bump has an octagonal structure having a width of, for example, 100 μm when viewed from above.

Figure 4B:
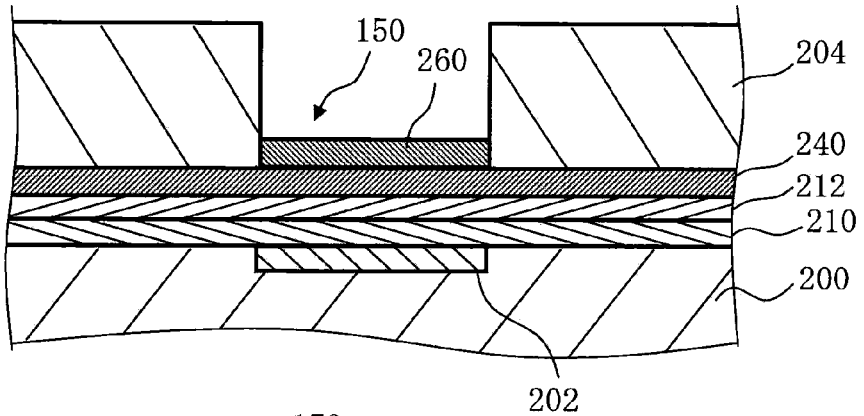

As shown in FIG. 4B, as the Cu plating process (S112), a Cu film 260 is formed (deposited) in the opening 150 by the electrochemical growth method such as electro-plating using the Cu film 240 exposed by the opening 150 as a cathode electrode. Here, the Cu film 260 is formed to have a thickness of 700 nm so that the total thickness of the Cu film 240 and the Cu film 260 becomes 1 μm. Since control is exercised in such a manner that the average crystal size of the Cu film 240 as the foundation film is 10 μm or less and also that the number of crystals whose crystal orientation is the (111) orientation is increased in the Cu film 240 as described above, the surface of the plated Cu film 260 is formed without unevenness and the crystal orientation can be aligned in the (111) orientation. As a result, the Cu film 260 can be formed in such a way that the direction of grain boundary of the Cu film 260 is aligned in a substantially longitudinal direction, which is substantially perpendicular to the surface of the semiconductor substrate 200.

Figure 4C:
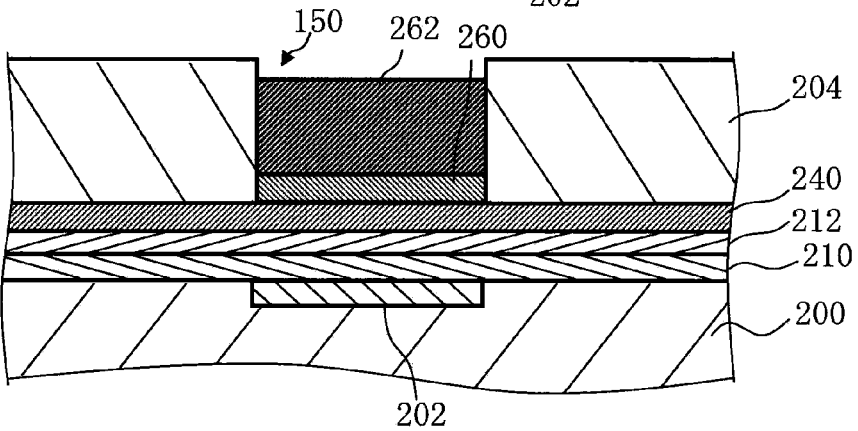

As shown in FIG. 4C, as the Sn plating process (S114), an Sn film 262 is formed (deposited) on the Cu film 260 in the exposed opening 150 by plating. Here, the Sn film 262 is formed to have the thickness of, for example, 50 μm. The Sn film 262 grows following crystallinity of the Cu film 260. The Cu film 260, which is a Cu plated film, is uniformly oriented and has a shape without unevenness, and thus the Sn film 262 can be formed in such a way that the direction of grain boundary of the Sn plating is also aligned in a substantially longitudinal direction, which is substantially perpendicular to the surface of the semiconductor substrate 200.

Figure 4D:
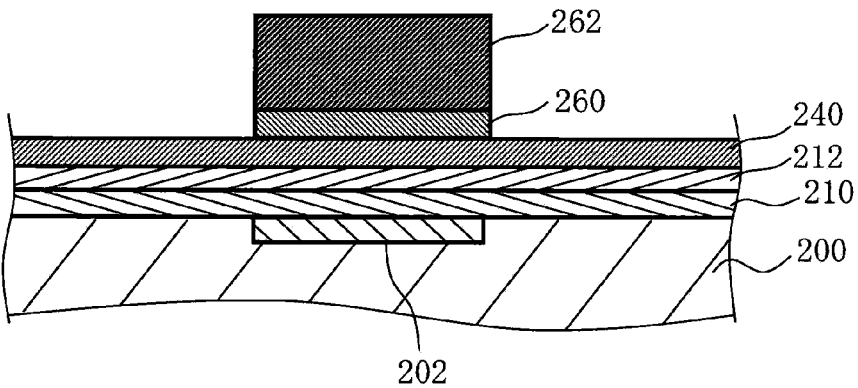

As shown in FIG. 4D, as the resist removal process (S116), the resist film 204 remaining on the Cu film 240 is separated (removed) by dissolving the resist film 204 in an organic solvent.

Figure 5A:
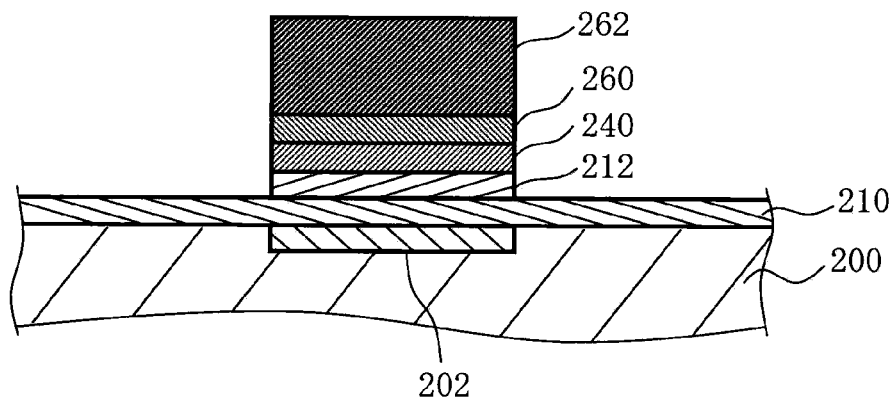
FIG. 5A to FIG. 5C are process sectional views showing processes performed corresponding to the flow chart in FIG. 1.
Figure 5B:
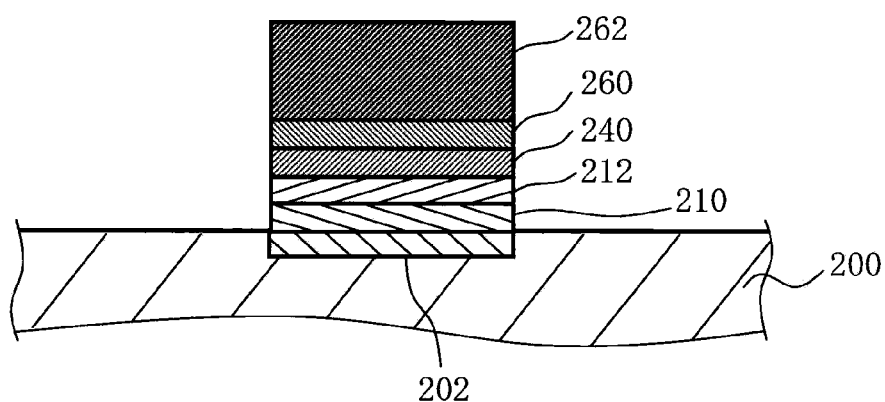
Figure 5C:
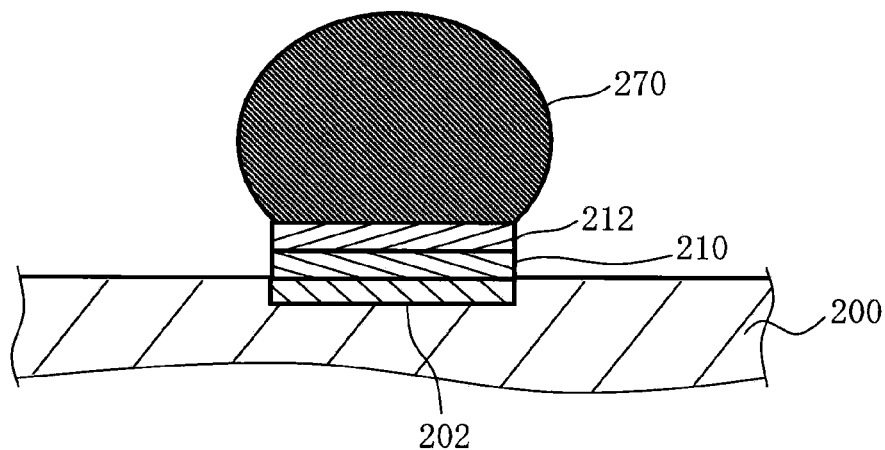

FIG. 5A to FIG. 5C are process sectional views showing processes performed corresponding to the flow chart in FIG. 1. FIG. 5A to FIG. 5C show from the Cu/Ni etching process (S118) to the reflow process (S122) in FIG. 1. Processes thereafter will be described later.

As shown in FIG. 5A, as the Cu/Ni etching process (S118), the exposed Cu film 240 and the Ni film 212 as the lower layer thereof are removed by wet etching using the Sn film 262 as a hard mask. A mixed solution of hydrogen peroxide ($H_2O_2$) and acid can be used as an etchant.

As shown in FIG. 5B, as the Ti etching process (S120), the exposed Ti film 210 is removed by wet etching using the Sn film 262 as a hard mask. Dilute hydrofluoric acid (HF) diluted to a concentration of 0.5 to 1% can be used as an etchant. Or, a mixed solution of hydrogen peroxide ($H_2O_2$) and alkali can be used.

As shown in FIG. 5C, as the reflow process (S122), the Sn film 262 and the Cu films 240 and 260 to be solder materials are reflowed to change into a substantially spherical shape to form a solder bump 270. It is suitable to heat up to 300° C. In the reflow process, Cu forming the Cu films 240 and 260 is melted and swiftly diffused along grain boundaries of Sn. Thus, when the Cu films 240 and 260 and the Sn film 262 are changed into the solder bump 270 of a substantially spherical shape, the Cu films 240 and 260 are melted to diffuse to the grain boundaries of the Sn film 262, which is the other solder material film, and in a condition where the diffused Cu films 240 and 260 remain in the grain boundaries, crystals of the solder bump 270 are grown. The diffused Cu produces an effect of orienting the crystal growth by remaining on the grain boundaries to which the Cu diffused. By thus melting Cu and diffusing the melted Cu to the grain boundaries of Sn, the solder bump 270 of SnCu free from lead in which grain boundaries are aligned in a substantially longitudinal direction can be formed. If Cu is not melted and formed like a pedestal of Sn, Cu is not diffused to grain boundaries of Sn and thus, it becomes difficult to align grain boundaries of the solder bump in the desired longitudinal direction. Therefore, according to the first embodiment, both the diffused Cu films 240 and 260 are melted and incorporated into the solder bump 270 of SnCu without leaving a film only of Cu.

Figure 6A:
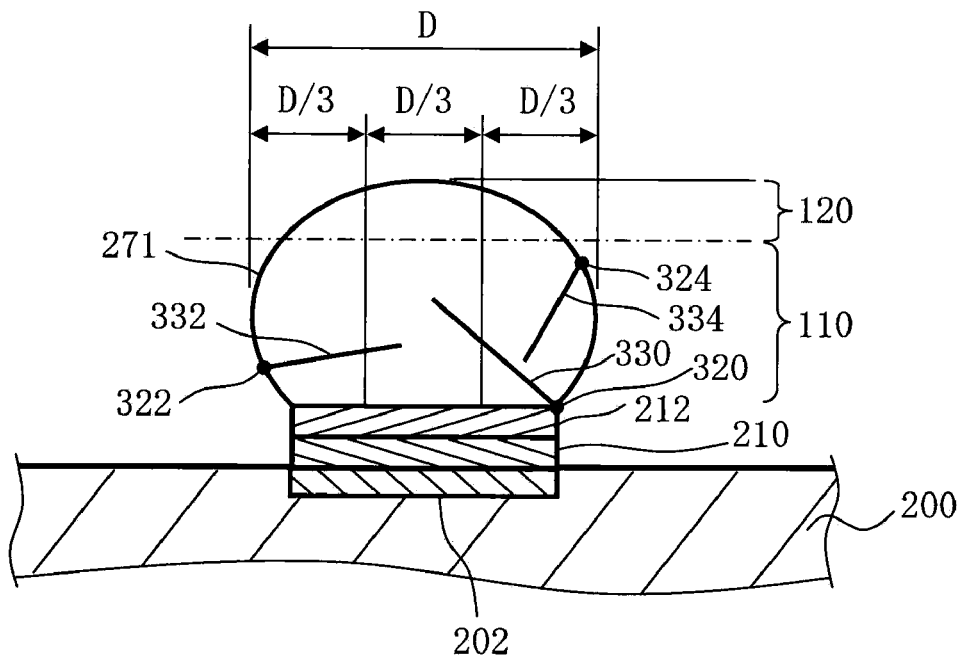
FIG. 6A and FIG. 6B are schematic diagrams exemplifying a grain boundary causing a bump crack and a grain boundary of solder bump according to the first embodiment.
Figure 6B:
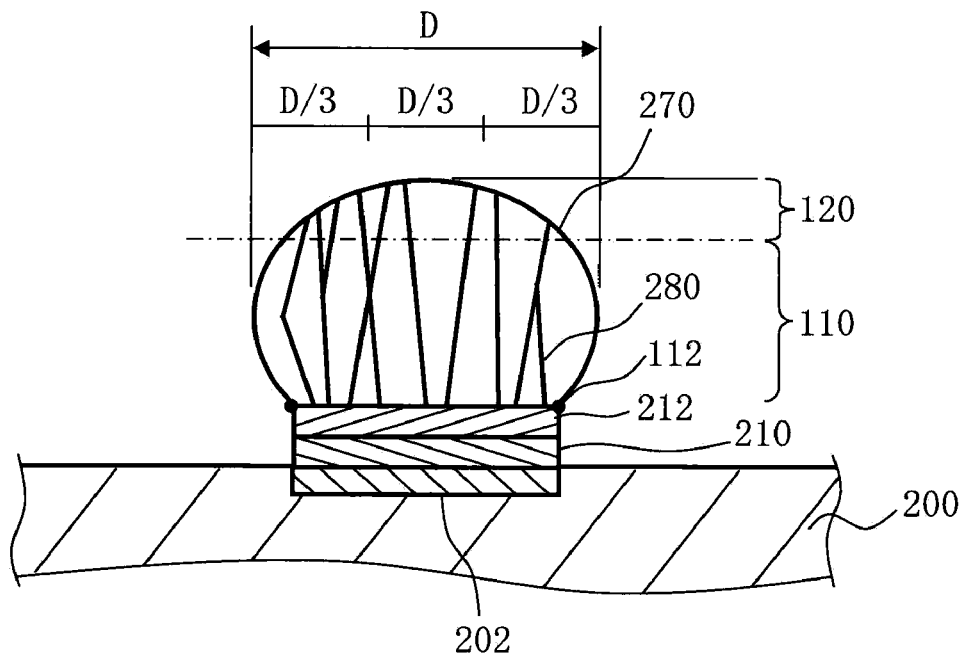

FIG. 6A and FIG. 6B are schematic diagrams exemplifying a grain boundary causing a bump crack and a grain boundary of solder bump according to the first embodiment. In a solder bump 271 fabricated by a conventional process in which the crystal sizes and crystal orientations of the UBM layers are not particularly controlled, unfortunately, grain boundaries, which extend equal to or over ⅓ of a diameter dimension D of the solder bump 271 from an outer circumferential surface between an end 320 of the connection part with the semiconductor substrate 200 and a lateral portion 110, are formed as shown in FIG. 6A. FIG. 6A shows a grain boundary 330 extending from the end 320 of the connection part of the solder bump 271 with the semiconductor substrate 200. Also, a grain boundary 332 extending from some position 322 on the outer circumferential surface in the lateral portion 110 is shown. Further, a grain boundary 334 extending from some position 324 on the outer circumferential surface in the lateral portion 110 is shown. The grain boundaries 330, 332, and 334 all extend equal to or over ⅓ of the diameter dimension D of the solder bump 271 and may cause bump cracks. After flip chip connection, a portion shown as a region 120 is connected to a solder bump on the package side and thus is not exposed, but if a grain boundary extends from the outer circumferential surface between the end 320 and the lateral portion 110 that is exposed even after the flip chip connection, cracks may appear from there as a starting point to cause bump cracks. Particularly, a portion close to the end 320 is an area where stress concentrations are more likely to occur due to a contraction caused by thermal change, and thus likely to cause bump cracks. If bump cracks extend equal to or over ⅓ of the diameter dimension D, resistance of the solder bump 271 increases to 1.33 times, exceeding a tolerance limit generally permitted in the semiconductor industry. If a grain boundary extends equal to or over ⅓ of the diameter dimension D from the outer circumferential surface between the end 320 and the lateral portion 110, when a bump crack occurs, the bump crack propagates equal to or over ⅓ of the diameter dimension D. Therefore, it is important not to allow formation of such a grain boundary whose length is equal to ⅓ of the diameter dimension D or larger in a fabrication stage.

In contrast, in the solder bump 270 fabricated by the fabrication method according to the first embodiment, as shown in FIG. 6B, no grain boundary extending equal to or over ⅓ of the diameter dimension D of the solder bump 270 is formed from the outer circumferential surface between an end 112 of a connection part with the semiconductor substrate 200 and the lateral portion 110. This is because directions of grain boundaries 280 of the solder bump 270 are aligned in a substantially longitudinal direction, which is a direction substantially perpendicular to the surface of the semiconductor substrate 200, by forming the surface of the Cu film 260 without unevenness and aligning both the Cu film 260 and the Sn film 262 in the (111) orientation. The lateral portion 110 is a remaining portion of an outer circumferential surface of the solder bump 270 excepting both of a connection part with the semiconductor substrate 200 and a connection part with the package-side substrate shown as the region 120 when the semiconductor substrate 200 and the package-side substrate are connected.

By controlling the crystal sizes and crystal orientations of the Cu film 240 as a foundation film before plating, as described above, it becomes possible to form the surface of the Cu film 260 without unevenness and align both the Cu film 260 and the Sn film 262 in the (111) orientation and thus possible to align directions of the grain boundaries 280 of the solder bump 270 in a substantially longitudinal direction. As a result, bump cracks exceeding a tolerance limit can be suppressed.

Figure 7:
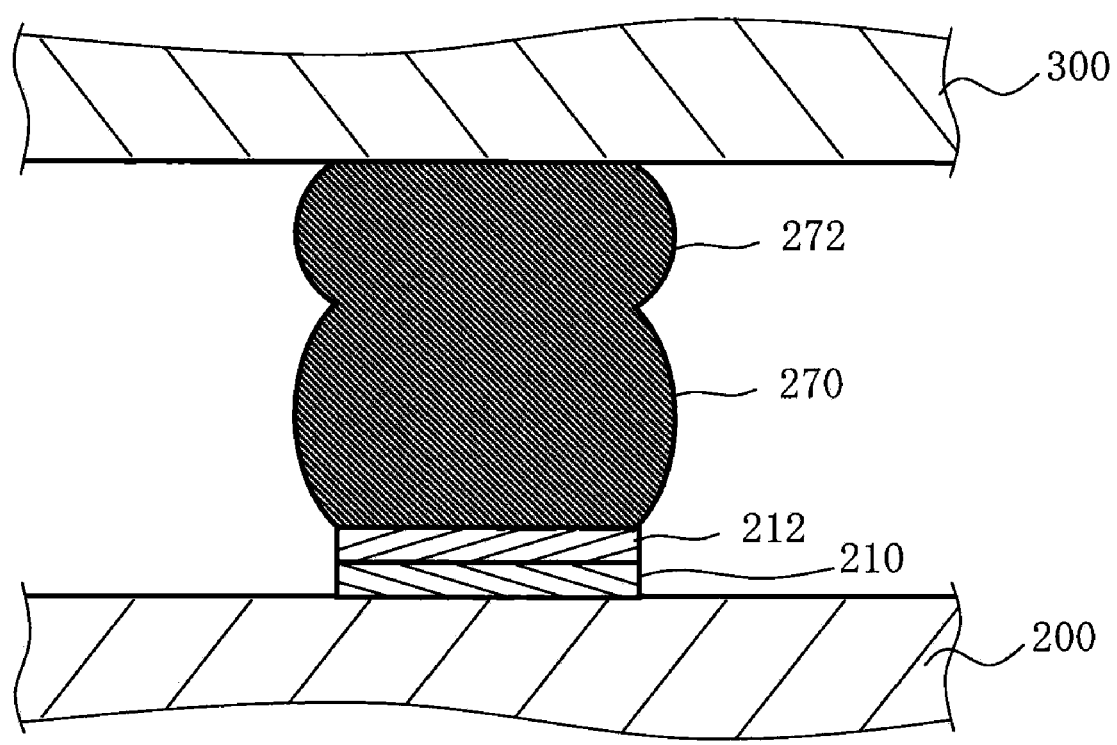
FIG. 7 is a process sectional view showing a process performed corresponding to the flow chart in FIG. 1.

FIG. 7 is a process sectional view showing a process performed corresponding to the flow chart in FIG. 1. FIG. 7 shows the flip chip connection process (S124) in FIG. 1.

As shown in FIG. 7, as the flip chip connection process (S124), the semiconductor substrate 200 and a package substrate 300 are flip chip connected. More specifically, the solder bump 270 on the semiconductor substrate 200 side and a solder bump 272 on the package substrate 300 side are heated for connection. As a result, a flip chip connected semiconductor device as shown in FIG. 7 is formed. In FIG. 7, electrode pad on either the semiconductor substrate 200 side or the package substrate 300 side is not illustrated.

Figure 8A:
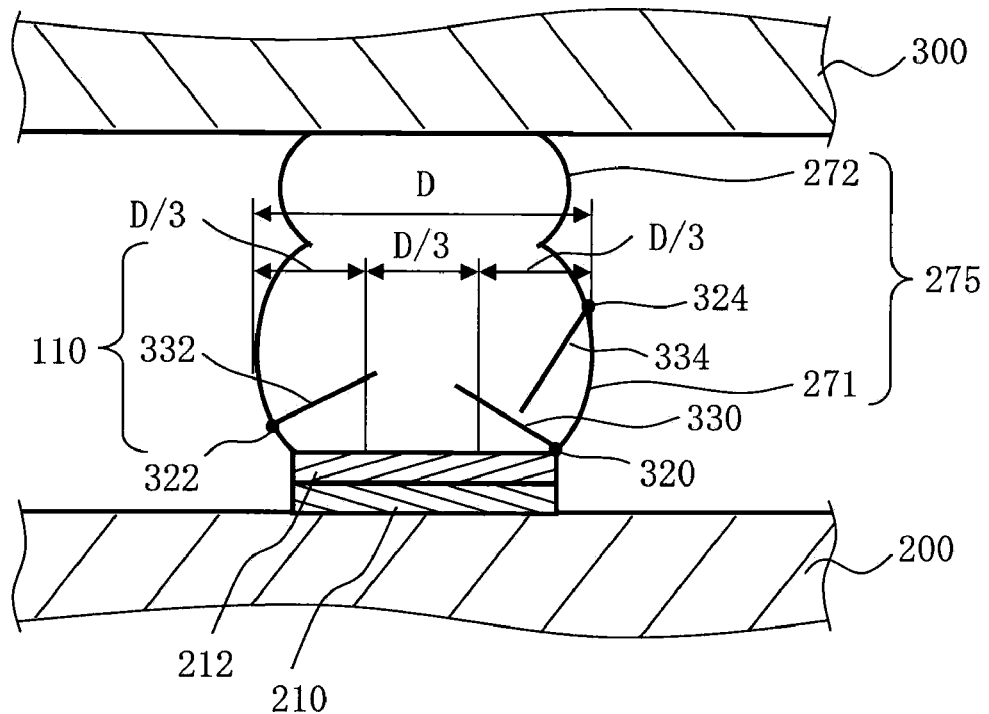
FIG. 8A and FIG. 8B are schematic diagrams exemplifying the grain boundary causing bump cracks after flip chip connection and grain boundary of solder bump according to the first embodiment.
Figure 8B:
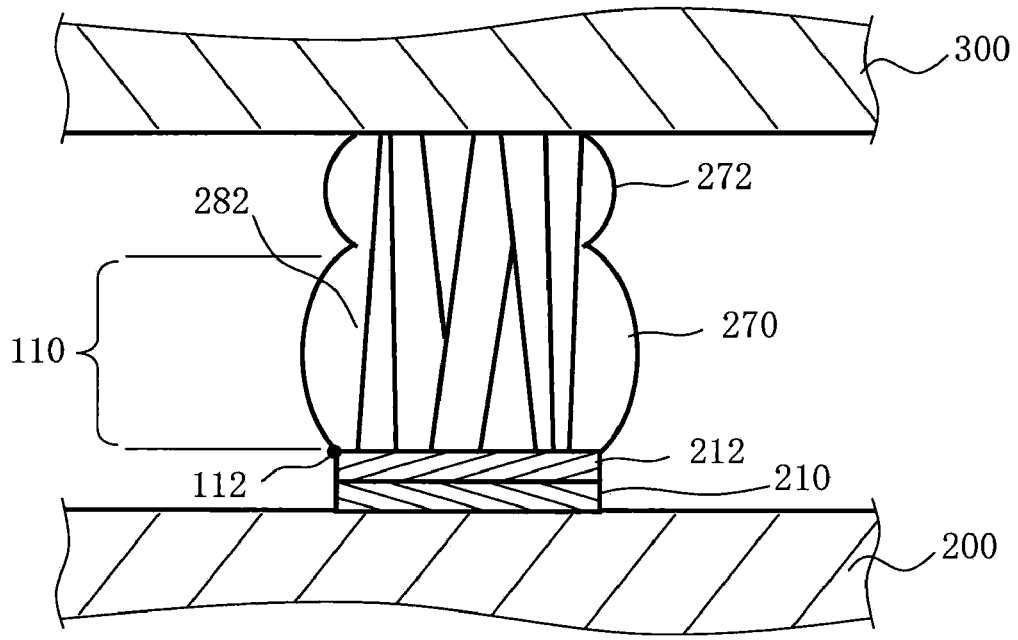

FIG. 8A and FIG. 8B are schematic diagrams exemplifying the grain boundary causing bump cracks after flip chip connection and grain boundary of solder bump according to the first embodiment.

Unfortunately in the solder bump 271 fabricated by a conventional fabrication method, grain boundaries, which extend equal to or over ⅓ of the diameter dimension D of the solder bump 271 from the outer circumferential surface between the end 320 of the connection part with the semiconductor substrate 200 and the lateral portion 110, are formed as shown in FIG. 8A after flip chip connection. In FIG. 8A, a grain boundary 330 extending from the end 320 of the connection part between the solder bump 271 and the semiconductor substrate 200 is shown. Also, the grain boundary 332 extending from some position 322 on the outer circumferential surface in the lateral portion 110 is shown. Further, the grain boundary 334 extending from some position 324 on the outer circumferential surface in the lateral portion 110 is shown. The grain boundaries 330, 332, and 334 all extend equal to or over ⅓ of the diameter dimension D of the solder bump 271 and may cause bump cracks. If a grain boundary extends from the outer circumferential surface between the end 320 and the lateral portion 110 that is exposed even after flip chip connection, cracks may appear from there as a starting point to cause bump cracks as described above.

In contrast, in the solder bump 270 fabricated by the fabrication method according to the first embodiment, as shown in FIG. 8B, no grain boundary extending equal to or over ⅓ of the diameter dimension D of the solder bump 270 is formed from the outer circumferential surface between the end 112 of the connection part with the semiconductor substrate 200 and the lateral portion 110 after flip chip connection. This is because directions of grain boundaries 282 of the solder bump 270 are aligned in a substantially longitudinal direction, which is a direction substantially perpendicular to the surface of the semiconductor substrate 200, even after flip chip connection by forming the surface of the Cu film 260 without unevenness and aligning both the Cu film 260 and the Sn film 262 in the (111) orientation. Moreover, also for the solder bump 272 on the package substrate 300 side after flip chip connection, core crystals are present on the solder bump 270 side and thus the grain boundaries of the solder bump 272 follow the direction of the grain boundaries 282 of the solder bump 270 and thus, the direction thereof can also be aligned in a substantially longitudinal direction.

In the solder bump 270 after flip chip connection, as described above, no grain boundary extends equal to or over ⅓ of the diameter dimension D from a portion of the outer circumferential surface arranged between the semiconductor substrate 200 and the package substrate 300, excepting of the connection part with the semiconductor substrate 200 and that with the package substrate 300. That is, a semiconductor device after flip chip connection in the first embodiment includes the semiconductor substrate 200, the package substrate 300 connected to the semiconductor substrate 200, and the solder bump 270 as described above. With the above configuration, bump cracks exceeding a tolerance limit can be suppressed.

If a solder bump, in which crystal grains are aligned in a substantially longitudinal direction as shown in FIG. 6B or FIG. 8B, is used, crack development can be controlled to within the tolerance limit. Further, even if cracks develop in the worst case, cracks run in a substantially longitudinal direction so that electric conduction is maintained and breaking of wire is not caused. Therefore, a solder bump whose grain boundaries are aligned in a substantially longitudinal direction can be considered to have double safety arrangements.

Second Embodiment

In the first embodiment, a case in which the Cu film 260 is formed by plating after the Cu film 240 as a foundation film is formed, but the present invention is not limited to this. In a second embodiment, a case in which a Cu film to be one of materials of a solder ball bump is formed exclusively by the sputter process without plating will be described.

Figure 9:
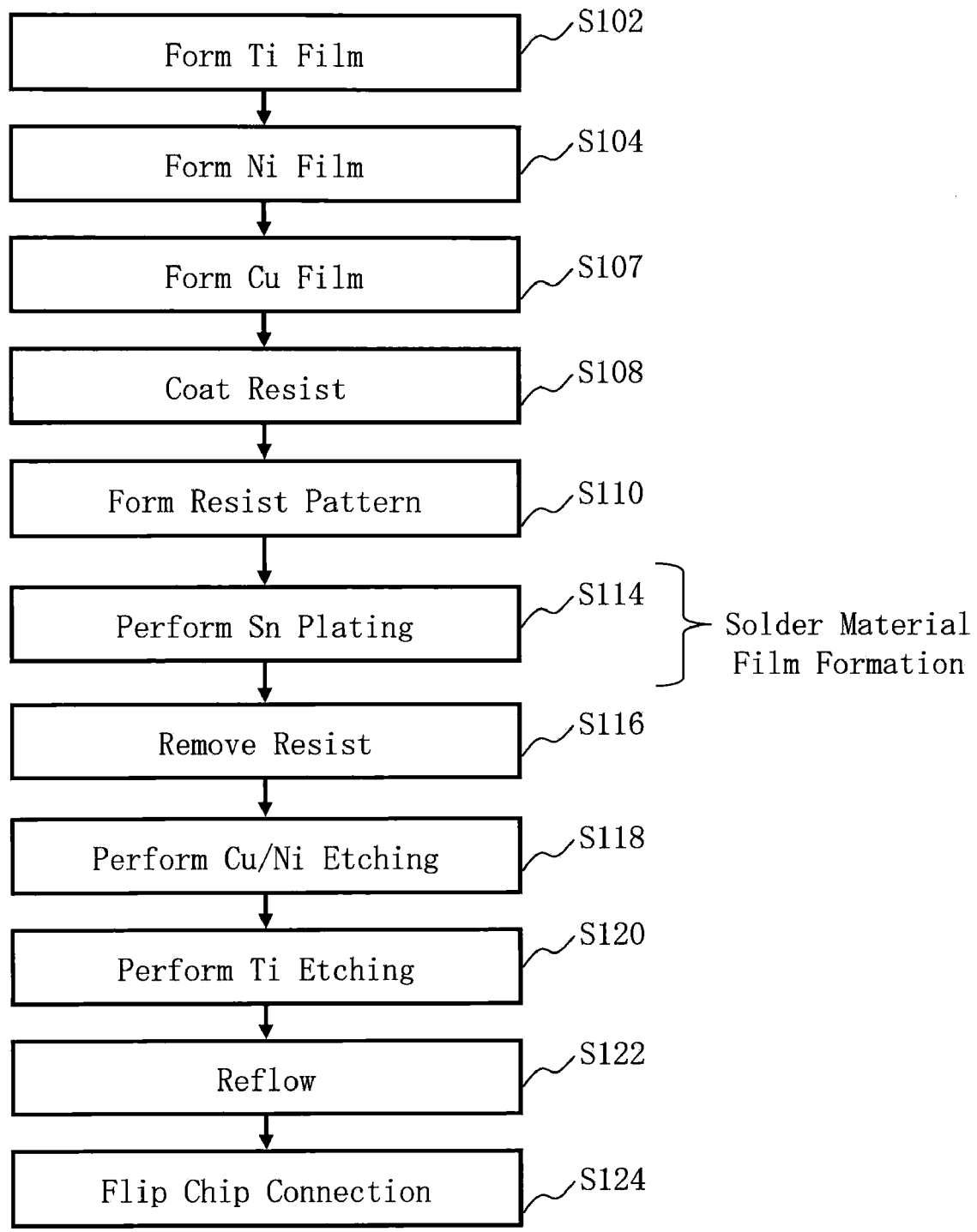
FIG. 9 is a flow chart showing principal parts of the method for fabricating a semiconductor device according to a second embodiment.

FIG. 9 is a flow chart showing principal parts of the method for fabricating a semiconductor device in the second embodiment. In FIG. 9, respective processes are the same as those in the first embodiment except that the Cu foundation film formation process (S106) is replaced by a Cu film formation process (S107) and the Cu plating process (S112) is deleted. Respective processes from the Ti film formation process (S102) to the Ni film formation process (S104) are the same as those in the first embodiment.

Figure 10A:
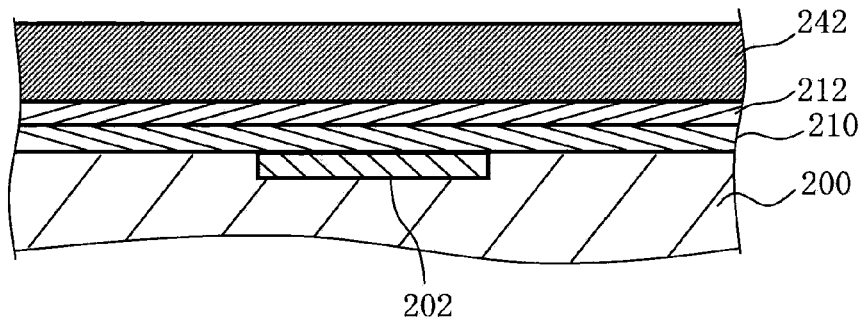
FIG. 10A to FIG. 10C are process sectional views showing processes performed corresponding to the flow chart in FIG. 9.
Figure 10B:
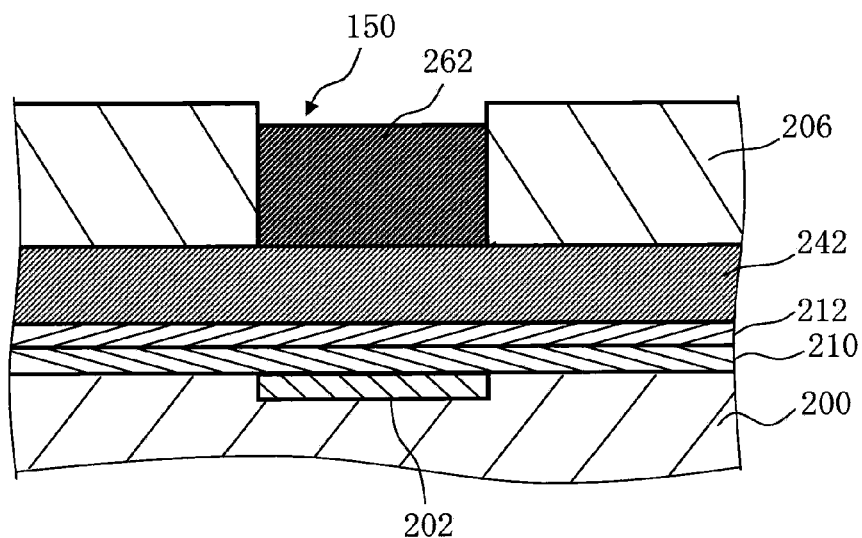
Figure 10C:
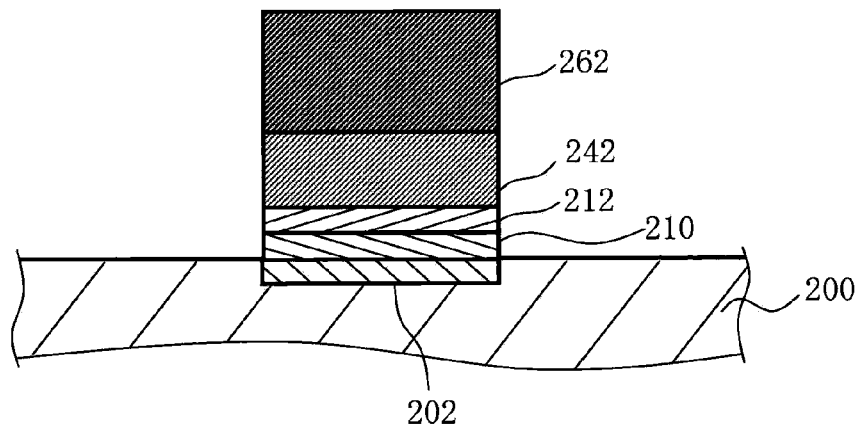

FIG. 10A to FIG. 10C are process sectional views showing processes performed corresponding to the flow chart in FIG. 9. FIG. 10A to FIG. 10C show from the Cu film formation process (S107) to the Ti etching process (S120) in FIG. 9.

As shown in FIG. 10A, as the Cu film formation process (S107), a Cu film 242 is formed on the Ni film 212 by the sputter process to a thickness of, for example, 1 μm. The Cu film 242 serves both as one layer (third layer) of the UBM layers in the solder bump formation process on the semiconductor substrate 200 side and as a material film of a solder ball bump. Here, in the second embodiment, the crystal sizes (grain sizes) of the Cu film 242 and the orientation of the Cu film 242 are controlled when the Cu film 242 is formed similarly to the first embodiment. It is same as the first embodiment that the average crystal size is controlled to 10 μm or less when the Cu film 242 is formed and that a control is exercised to increase the number of crystals whose crystal orientation is the (111) orientation in an initial film formed initially when the Cu film 242 grows, for example, a film up to 30% of the film thickness. Moreover, the control methods thereof are the same as those in the first embodiment. Even if the crystal orientation of the Cu film 242 initially contains crystals in orientations other than the (111) orientation, like the Cu film 260 in the first embodiment, the crystal orientation can be converged into the (111) orientation as the Cu film 242 grows. Then, the resist coating process (S108) and the resist pattern formation process (S110) similar to those in the first embodiment are performed.

As shown in FIG. 10B, as the Sn plating process (S114), the Sn film 262 is formed (deposited) on the Cu film 242 exposed by plating at the bottom of the opening 150. Other than as described, the process is the same as that in the first embodiment. The cross section shown in FIG. 10C can be formed by subsequently performing the resist removal process (S116), the Cu/Ni etching process (S118), and the Ti etching process (S120) similarly to the first embodiment. Here, the Cu film in the second embodiment is thicker than that in the first embodiment and thus, it is suitable to use a chemical solution whose attack on the Sn film 262 is suppressed as an etchant in the Cu/Ni etching process (S118). More specifically, a mixed solution of hydrogen peroxide ($H_2O_2$) with an additive and acid may be used. As an additive, for example, a chelating agent such as EDTA can be used.

Then, the reflow process (S122) similar to that in the first embodiment is performed. Similarly to the first embodiment, Cu forming the Cu film 242 is melted and swiftly diffused along grain boundaries of Sn in the reflow process. Thus, when the Cu film 242 and the Sn film 262 are changed into the solder bump 270 of a substantially spherical shape, the Cu film 242 is melted and diffused to grain boundaries of the Sn film 262, which is a solder material film, and crystals of the solder bump 270 are grown in a condition where the diffused Cu film 242 remains in the grain boundaries. The diffused Cu produces an effect of orienting the crystal growth by remaining on the grain boundaries to which the Cu diffused. By thus melting Cu and diffusing the melted Cu to the grain boundaries of Sn, the solder bump 270 of SnCu free from lead in which grain boundaries are aligned in a substantially longitudinal direction can be formed. Accordingly, according to the second embodiment, the Cu film 242 is melted and incorporated into the solder bump 270 of SnCu without leaving a film only of Cu. By performing the reflow process (S122) described above, a semiconductor device having the solder bump 270, in which no grain boundary extending equal to or over ⅓ of the diameter dimension D of the solder bump 270 is formed from the outer circumferential surface between the end 112 of the connection part with the semiconductor substrate 200 and the lateral portion 110 as shown in FIG. 5C and FIG. 6B, can be fabricated similarly to the first embodiment. Also, by performing the flip chip connection process (S124) similar to the first embodiment, a semiconductor device after flip chip connection having the solder bump 270, in which no grain boundary extending equal to or over ⅓ of the diameter dimension D of the solder bump 270 is formed from the outer circumferential surface between the end 112 of the connection part with the semiconductor substrate 200 and the lateral portion 110 as shown in FIG. 7 and FIG. 8B, can be fabricated similarly to the first embodiment.

In the foregoing, embodiments have been described with reference to concrete examples. However, the present invention is not limited to these concrete examples. For example, SnCu is used as the material of the solder bump, but the material of the solder bump is not limited to this and tin-silver-copper (SnAgCu) or tin-silver-copper-nickel (SnAgCuNi) may be used. When a solder bump of SnAgCu is formed, SnAg plating, instead of Sn plating, may be performed. When a solder bump of SnAgCuNi is formed, an alloy may be produced by melting up to the Ni film 212 during the reflow process.

An electrode of appropriately selected size, shape, number and the like as required for semiconductor integrated circuits and various semiconductor elements can be used.

In addition, all semiconductor devices and methods for fabricating a semiconductor device that have elements of the present invention and whose design can be obtained by appropriately modifying by persons skilled in the art are included in the scope of the present invention.

While techniques normally used in the semiconductor industry, such as a photolithography process and cleaning before and after a process are not described for convenience of description, it is needless to say that such techniques are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device, comprising:
   a first semiconductor substrate;
   an under-bump metal (UBM) layer formed directly on the first semiconductor substrate; and
   a solder bump part:
      formed on the first semiconductor substrate via the UBM layer; and
      comprising a plurality of crystal gains in which all grain boundaries extend over less than ⅓ of a diameter dimension of said solder bump part from an outer circumferential surface of a lateral portion of the solder bump part, the lateral portion being a part of the solder bump part excluding a connection part with the first semiconductor substrate and excluding a connection part with a second substrate, in case that the first semiconductor substrate and the second substrate are connected.

2. The semiconductor device according to claim 1, wherein the UBM layer includes a nickel (Ni) film in contact with the solder bump part.

3. The semiconductor device according to claim 1, wherein copper (Cu) is diffused to grain boundaries of the solder bump part.

4. The semiconductor device according to claim 1, wherein the solder bump part is a solder bump of tin-copper (SnCu).

5. The semiconductor device according to claim 1, wherein the solder bump part is a first solder bump part and is used for a flip chip connection process when the first solder bump part of the first semiconductor substrate and a second solder bump part of the second substrate are connected.

6. The semiconductor device according to claim 1, wherein when forming the UBM layer, the UBM layer includes a copper (Cu) film having (111) orientation.

7. The semiconductor device according to claim 6, wherein an average crystal size of the Cu film is 10 µm or less.

8. The semiconductor device according to claim 6, the Cu film of the UBM layer becomes a part of the solder bump part by being reflowed.

9. A semiconductor device, comprising:
   a first semiconductor substrate;
   a second substrate connected to the first semiconductor substrate;
   an under-bump metal (UBM) layer formed directly on the first semiconductor substrate; and
   a solder bump part:
      formed on the first semiconductor substrate via the UBM layer;
      arranged between the first semiconductor substrate and the second substrate; and
      comprising a plurality of crystal pains in which all grain boundaries extend over less than ⅓ of a diameter dimension of said solder bump part from a part of an outer circumferential surface of the solder bump part between a connection part with the first semiconductor substrate and a connection part with the second substrate.

10. The semiconductor device according to claim 9, wherein the UBM layer includes a nickel (Ni) film in contact with the solder bump part.

11. The semiconductor device according to claim 9, wherein copper (Cu) is diffused to grain boundaries of the solder bump part.

12. The semiconductor device according to claim 9, wherein the solder bump part is a solder bump of tin-copper (SnCu).

* * * * *